United States Patent [19]

Longenecker et al.

[11] Patent Number: 4,518,983
[45] Date of Patent: May 21, 1985

[54] ASSEMBLY-HEAT SINK FOR SEMICONDUCTOR DEVICES

[75] Inventors: Kenneth G. Longenecker, Greensburg; Thomas B. Geary, Derry, both of Pa.

[73] Assignee: Westinghouse Electric Corp., Pittsburgh, Pa.

[21] Appl. No.: 436,104

[22] Filed: Oct. 22, 1982

[51] Int. Cl.³ .............. H01L 23/34; H01L 23/02; H01L 23/04; H01L 25/04
[52] U.S. Cl. .................. 357/81; 357/79; 357/74; 357/75
[58] Field of Search .......... 357/74, 75, 76, 79, 357/81

[56] References Cited

U.S. PATENT DOCUMENTS 4,218,695  8/1980  Egerbacher et al. ........... 357/81
4,414,562 11/1983  Kiley et al. ................... 357/81

Primary Examiner—Andrew J. James
Assistant Examiner—Sheila V. Clark
Attorney, Agent, or Firm—C. L. Menzemer

[57] ABSTRACT

The present invention is directed to an assembly-heat sink for semiconductor fusions. The fusions are disposed within the assembly-heat sink between cylindrical metal members which both cool the fusions and facilitate making electrical contact to the fusions. Top and bottom members of the assembly-heat sink, which entirely enclose the cylindrical members and the fusions are comprised entirely of metal permitting the assembly-heat sink to be cooled from three sides. The fusions are electrically insulated from the top and bottom members of the assembly-heat sink.

8 Claims, 13 Drawing Figures

ASSEMBLY-HEAT SINK FOR SEMICONDUCTOR DEVICES

BACKGROUND OF THE INVENTION

1. Field of Invention

The present invention is in the field of assemblies for semiconductor devices and heat sinks for semiconductor devices.

2. Description of Prior Art

Compression type assemblies for semiconductor devices are well known in the art as for example the stacking assembly taught in U.S. Pat. No. 3,447,118 and the assembly taught in U.S. Pat. No. 4,313,128.

The assembly of U.S. Pat. No. 3,447,118 does not function as a heat sink in addition to an assembly.

The assembly of U.S. Pat. No. 4,313,128 is a rather complex structure and cannot be cooled from three sides like the present invention.

U.S. Pat. No. 4,047,197 is a typical example of assemblies that are well known in the prior art. In such assemblies the devices are enclosed in a plastic housing which has a metal base. Cooling can only be accomplished along one side, the metal base. Furthermore, the devices are soldered to contacts within the housing rather than compression bonded and cannot be readily disassembled.

SUMMARY OF THE INVENTION

The present invention is directed to a semiconductor modular assembly and heat sink comprising a metal base member and metal top member, said base member having a top surface, a bottom surface and two end surfaces, said top member having a top surface, a bottom surface and two end faces, a central portion of said top surface of said base member being concave relative to said top surface, a central portion of said bottom surface of said top member being concave relative to said bottom surface, whereby when said top member is disposed on said base member, the concave portions of said top surface of said base member and the bottom surface of said top member form a cavity, said cavity having a circular cross-section, said cavity extending between the end faces of the base and top members, a plurality of metal cylindrical members disposed within said cavity, semiconductor fusions disposed within said cavity between adjacent cylindrical members, compression means holding said semiconductor fusions in an electrical and thermal conductive relationship with said adjacent metal cylindrical members, means for electrically insulating said cylindrical members and said fusions from said base and top members, and means for making electrical contact to said semiconductor fusions through said cylindrical members.

BRIEF DESCRIPTION OF THE DRAWINGS

For a better understanding of the nature of the present invention reference should be had to the following detailed discussion and drawings, of which.

DESCRIPTION OF PREFERRED EMBODIMENTS

The modular power semiconductor assembly of this invention provides both electrical insulation of the contained semiconductor wafers and thermally conductive paths from the semiconductor wafer to the case, thus providing a means for mounting and cooling of complex circuits in a common assembly-heat sink.

The semiconductor wafers or fusions used may be thyristors, transistors, rectifiers or combinations thereof.

Figure 1:
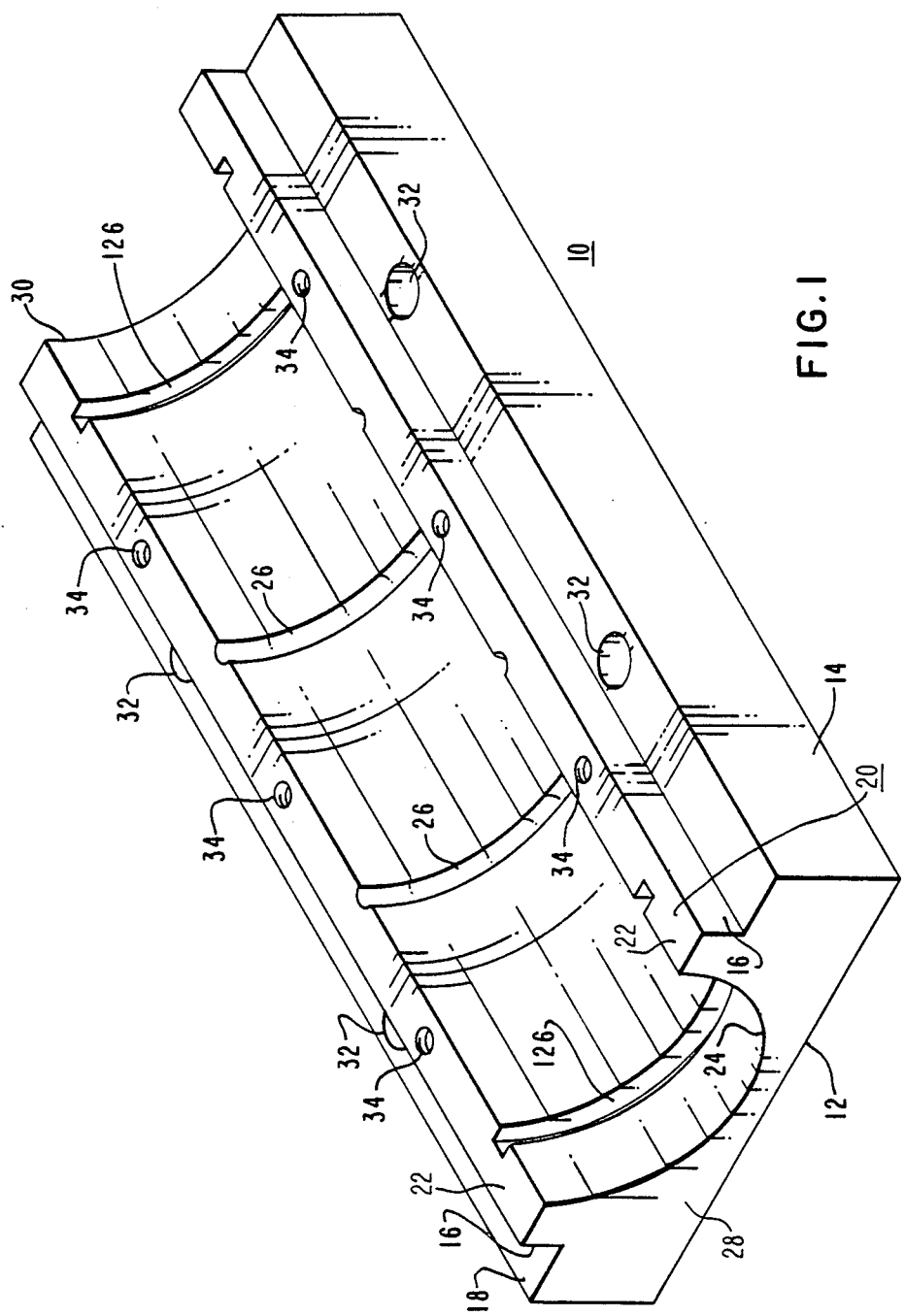
FIG. 1 is an isometric view of a base member of the assembly-heat sink of this invention.

With reference to FIG. 1, there is shown base member 10 of an assembly-heat sink for power semiconductors embodying the teachings of this invention.

The base member 10 has a bottom surface 12 and a first vertical, relative to bottom surface 12, edge portion 14 and a second vertical edge portion 16. The second vertical portion 16 is offset from the first vertical portion 14 by a horizontal step portion 18 which is substantially parallel to bottom surface 12.

Top surface 20 of base member 10 is comprised of two horizontal edge portions 22 extending inwardly from edge portion 16 and a concave curved portion 24 extending between the edge portions 22. The horizontal edge portions 22 are substantially parallel with the step portion 18 and bottom surface 12.

A series of external and internal grooves 126 and 26 respectively are formed in the concave curved portion 24 and extend entirely across the curved portion 24. The number of internal grooves 26 may vary from two to the number necessary, usually equaling the number of semiconductor fusions or wavers included in the assembly-heat sink. The function of the internal and external grooves will be discussed hereinbelow.

The base member 10 has two end faces 28 and 30.

The base member 10 has a plurality of apertures 32 extending entirely through the base member 10 from step portion 18 to bottom surface 12 for mounting the base member 10 to a bus bar, an additional heat sink member or the like. It will be understood that while four apertures 32 are shown in FIG. 1, the number is not critical provided the function is accomplished. The physical location of the apertures 32 is not critical again provided the function is accomplished.

A second plurality of apertures 34 extend into the base member 10 from the horizontal edge portion 22 of the top surface 20. Preferably, the apertures are threaded. While six apertures 34 are shown, any number of apertures may be present. The physical location of apertures 34 is not critical as long as the function, described herein below, is accomplished.

The base member 10 is comprised entirely of a metal, preferably aluminum, but may be of copper, steel, anodized aluminum, nickel coated steel or the like for the dissipation of heat from the power semiconductor wafers or fusions enclosed therein as will be described hereinbelow. The use of an entirely metal base member results in better heat dissipation than can be realized from a base member of a metal and some other material as for example a metal and a resinous material.

Figure 2:
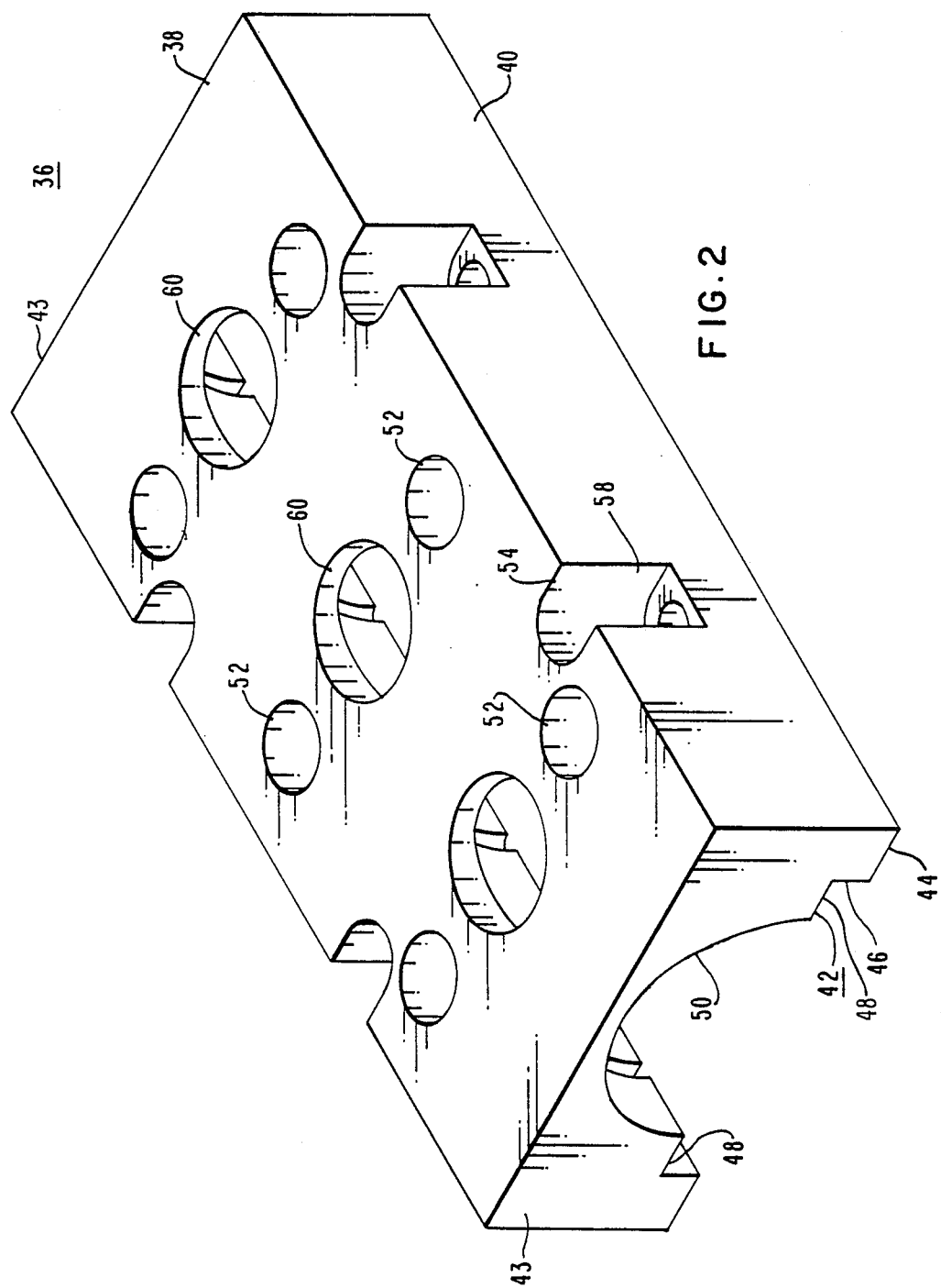
FIG. 2 is an isometric view of a top member of the assembly-heat sink of this invention.

With reference to FIG. 2, there is shown a top member 36 of the assembly-heat sink of this invention.

The top member 36 has a top surface 38, vertical edge portions 40, a bottom surface 42 and end faces 43.

The bottom surface 42 extending between the two edge portions consist of, extending inwardly from each edge portion, a first horizontal portion 44, a vertical portion 46, a second horizontal portion 48 and a concave curved portion 50 extending between the two second horizontal portions 48.

The first and second horizontal portions 44 and 48 respectively and top surface 38 are substantially parallel.

The curved portion 50 is a portion of a circle having the same radius as the curved portion 24 of the bottom member 10 and extends between the end faces 43. The curved portion 50 would be congruent with a circle formed by extending the curved portion 24 of base member 10.

The curved portion 24 of base member 20 and the curved portion 50 of the top member 36 form an aperture of circular cross-sectional configuration when the base member 10 and top member 36 are brought together. The circular cross-sectional configuration aperture extends between the end faces.

The top member 36 has a first plurality of apertures 52, for example, six apertures are shown, which extend entirely through top member 36 and line up vertically with apertures 34 in base member 10 when the base member 10 and top member 36 are brought together. The apertures 52 are countersunk into the top member 36.

The top member 36 has a second plurality of apertures 54 for example four are shown, which extend entirely through top member 36 and which line up vertically with apertures 32 in base member 10 when the base member 10 and top member 36 are brought together.

The apertures 54 are countersunk into the top member 36 and the countersunk portion 58 is exposed along a portion of the edge portion 40 of top member 36.

It is obvious that it is intended that the number of apertures 52 in top member 36 be equal to the number of apertures 34 in base member 10 and that the number of apertures 54 be equal to the number of apertures 32.

A third set of aperatures 60, for example three are shown, substantially circular, extend entirely through the top member 36. The apertures 60 are substantially spaced apart equally with their centers disposed on the central axis of the top surface 38 which central axis extends between the end faces 43.

There are a plurality of grooves, partially shown, in the curved portion 50 of the bottom surface 42 of the top member 36. The number of grooves in bottom surface 42 is equal to the number of grooves 26 and 126 in the curved portion 24 of top surface 20 of base member 10 and the grooves are vertically aligned so that the grooves are continuous and form a circle when the top member 36 and base member 10 are brought together.

The top member 36 is comprised of a metal, preferably the same metal as base member 10.

The use of a metal, preferably anodized aluminum for both the base member 10 and top member 36 ensures good heat dissipation from semiconductor wafers or fusions enclosed within the assembly-heat sink and allows connecting the assembly-heat sink itself along either of its side or bottom surface or along all three of these surfaces to another member or members to effect withdrawal of heat from the assembly-heat sink.

The length of base member 10 and top member 36, as measured between the respective end faces, is the same.

Figure 3:
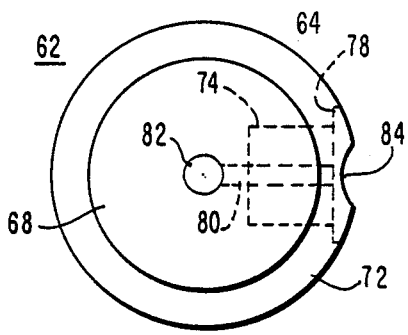
FIGS. 3 and 4 are front and top views respectively of cylindrical members of the assembly-heat sink of this invention.
Figure 4:
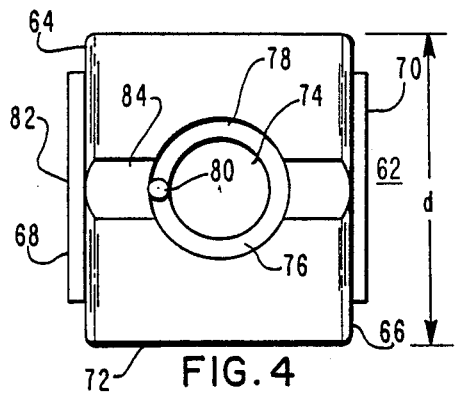

With reference to FIGS. 3 and 4, there is shown front and top views respectively of a cylindrical member or slug 62 which comprises a component of the assembly-heat sink of this invention.

The cylindrical member or slug 62 is a solid metal member comprised of for example copper, and may be plated with a second metal as for example, electrolysis nickel.

The cylindrical member 62 has a front surface 64 and a back surface 66. Each of the surfaces 64 and 66 have an extended portion or contact surface 68 and 70 respectively.

There is an edge portion 72 extending between the surfaces 64 and 66.

There is a first cylindrical aperture 74 disposed at substantially the mid-point of the edge 72 and extending perpendicularly from the surface of the edge portion 72 into the interior of the member 62 a predetermined distance. The aperture 74 has a countersunk portion 76 where it intersects edge portion 72 and this forms a shoulder 78.

A second and relatively smaller aperture 80 extends from the shoulder 78 vertically into the cyindrical member 62 and intersects with and terminates at a third aperture 82 which extends from the extended portion of surface 64 into the cylindrical member 62. The aperture 82 is centrally located on the extended portion or control surface 68 of surface 64 and preferably intersects aperture 80 at a right angle.

A keyway 84 is cut in the edge portion 72 and intersects the aperture 74.

The diameter "d" of the cylindrical member 62 is such that the cylindrical member 62 fits within and conforms to the curved concave portions 24 and 50 of base member 10 and top member 36 respectively.

Figure 5:
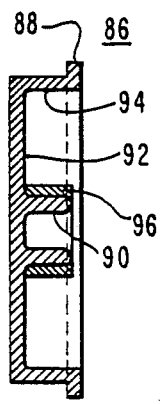
FIGS. 5 and 6 are side and front views respectively of end members of the assembly-heat sink of this invention.
Figure 6:
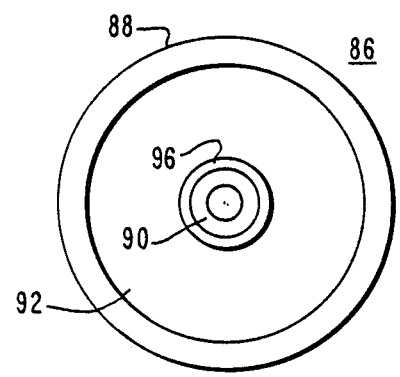

With reference to FIGS. 5 and 6, there is shown side and front views respectively of a metal end or retainer member 86. The end or retainer member 86 may be of any suitable metal as for example aluminum, copper or steel and is preferably of tin plated steel.

The diameter of the end or retainer member 86 is such that a rim 88 of end member 86 fits into the end grooves 126 of the bottom member 12 and the vertically aligned groove in the top member 36. The end or retainer member 86 has a ring shape nipple 90 centrally disposed on surface 92. The end member 86 has a shoulder portion 94 extending between surface 92 and rim 88.

Figure 7:
FIG. 7 is a front view of a washer used in the assembly-heat sink of this invention.

With reference to FIG. 7, there is shown a washer 96 of an electrically insulating material as, for example, mica or a suitable resin-impregnated fiber.

Figure 8:
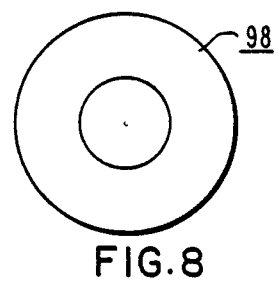
FIG. 8 is a front view of a thrust type washer used in the assembly-heat sink of this invention.

With reference to FIG. 8, there is shown a thrust washer as for example a Belleville washer 98 of, for example, steel.

Figure 9:
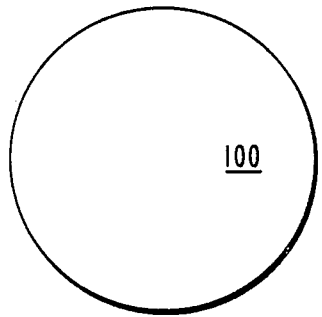
FIG. 9 is a front view of an electrically insulating disc suitable for use in the assembly-heat sink of this invention.

With reference to FIG. 9, there is shown an electrically insulating disc 100 of, for example, mica. The disc has a diameter greater than extended portion 68 or 70 of cylindrical member or slug 62 and less than the diameter of end member 86.

Figure 10:
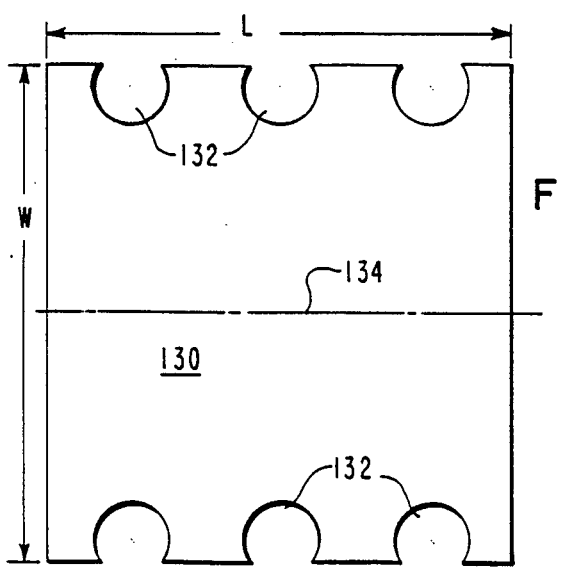
FIG. 10 is a top view of a dielectric sheet suitable for use in the assembly-heat sink of this invention.

With reference to FIG. 10, there is shown a sheet 130 of dielectric electrical insulating material as for example a silicon rubber sheet reinforced with fibers of for example fiberglass, or a sheet of tetrafluoroethylene, polytetrafluorethylene, trifluorochloroethylene with or without reinforcing fibers, fillers and the like.

The sheet 130 has a length "L" equal to the distance between the end grooves 126 and a width w such that it fits entirely around cylindrical or slug members 62 with cut away portions 132 fittings around apertures 74 in the cylindrical members 62. The sheet 130 is shown in position in FIGS. 11 and 12.

Figure 11:
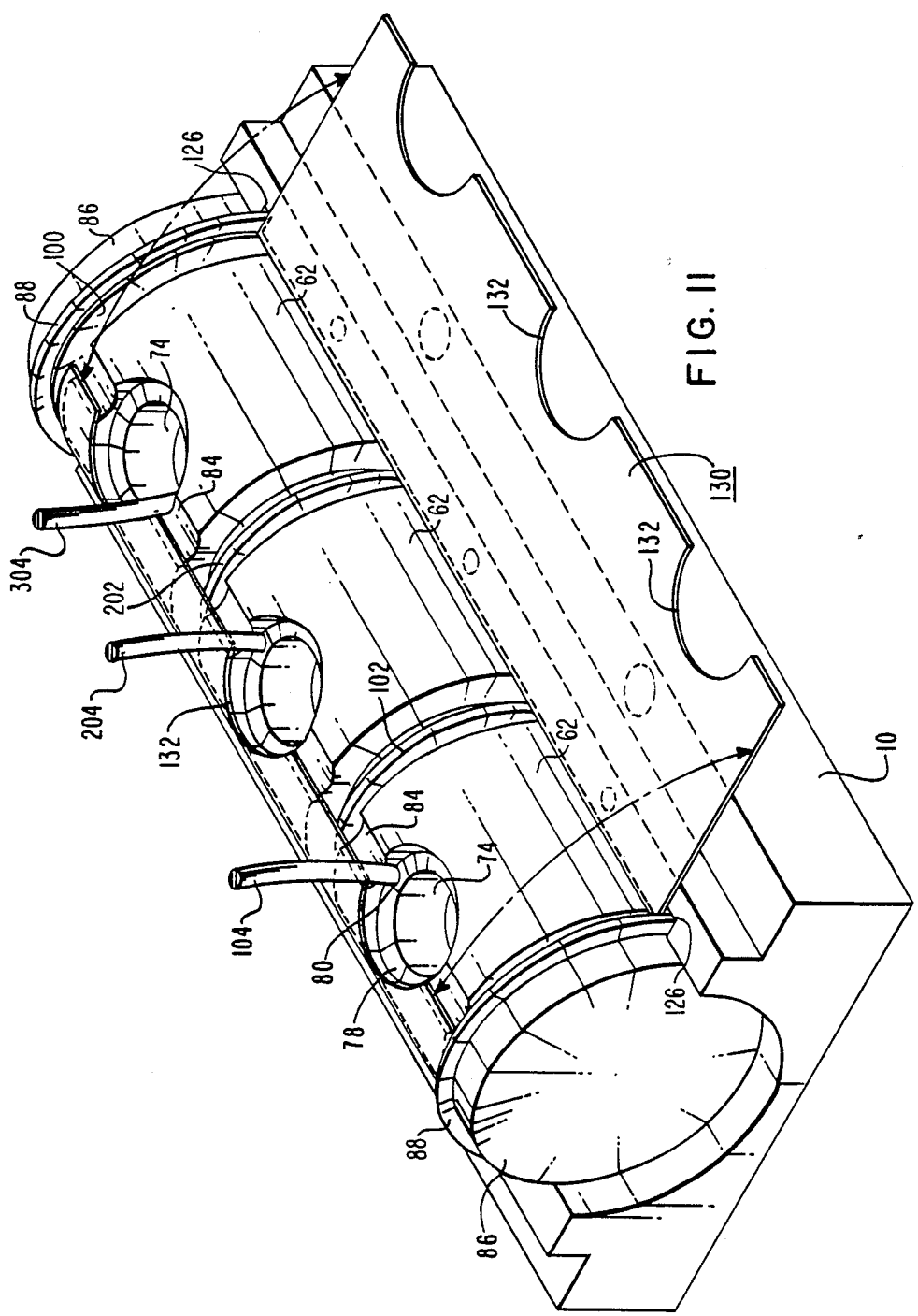
FIG. 11 is an isometric view of a partially assembled assembly-heat sink.
Figure 12:
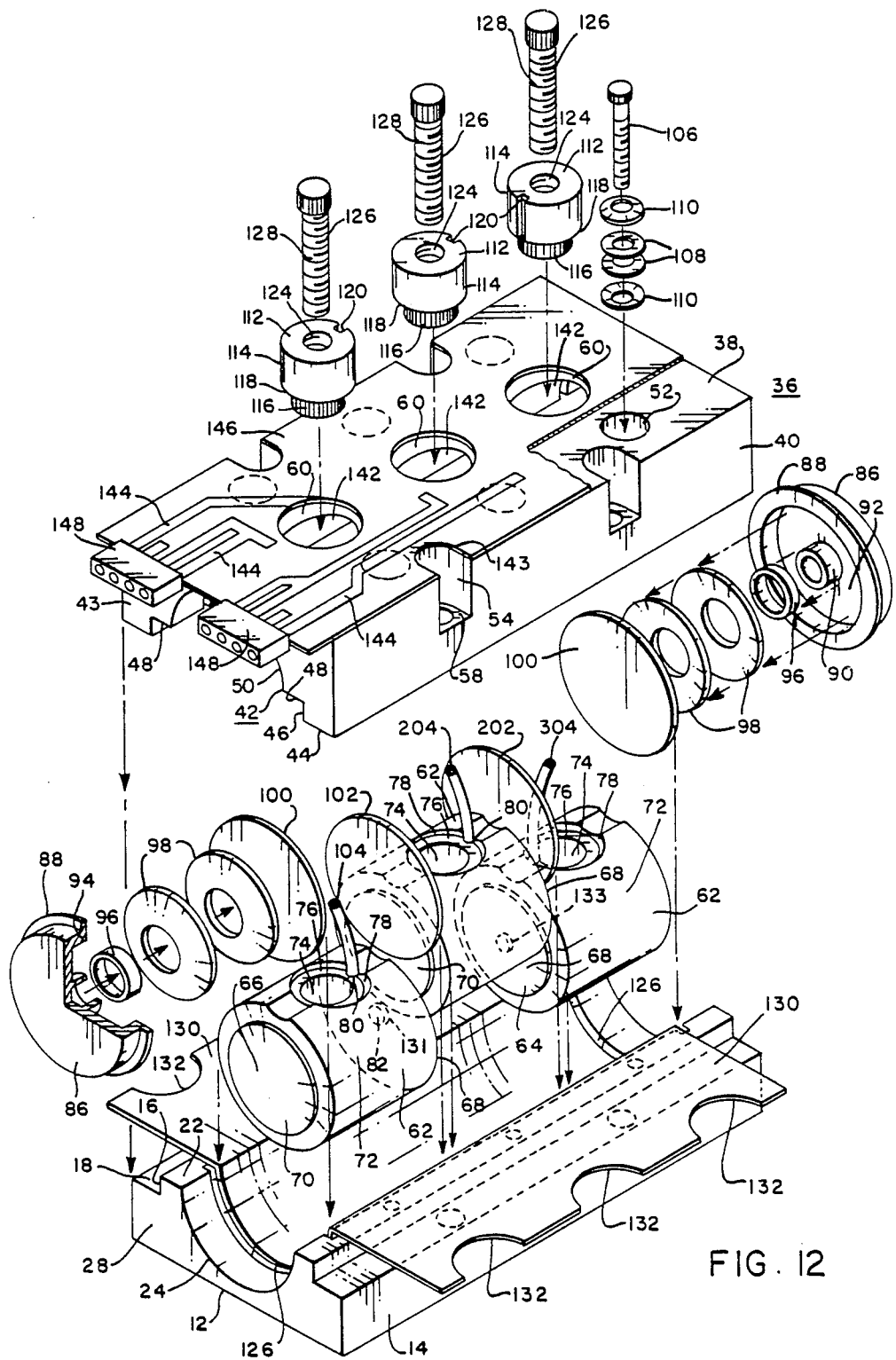
FIG. 12 is an exploded view of the assembly-heat sink of this invention with a printed circuit board disposed on the top surface thereof.

With reference to FIGS. 11 and 12, there is shown in FIG. 11 a partially assembled assembly-heat sink of this invention. FIG. 12 shows an exploded view of the assembly-heat sink.

The electrically insulating washer 96 has been disposed around the ring shaped nipple 90 of end or retainer member 86 (shown in FIGS. 5 and 6). Two or more Belleville washers 98 are disposed over or around the washer 96. The rim 88 of the end member 86 is inserted in one of the end grooves 126 in base member 10 with the nipple side of the end member facing inward or toward the other end groove 126.

Electrically insulating disc 100 is inserted in contact with the Belleville washers 98. Dielectric sheet 130 is deployed in curved portion 24 of bottom member with its central axis 134 (FIG. 10) along the central axis of the curved portion 24 and the cutaway portion extending in a general vertical direction. The sheet 130 extends between grooves 126. The first cylindrical member 62 is positioned on sheet 130 in curved portion 24 of base member 10 with extended portion or contact surface 70 in contact with electrically insulating disc 100.

A semiconductor wafer or fusion, as for example a thyristor wafer or fusion 102 is positioned in physical and electrical contact with contact surface 68 of the first cylindrical member 62. The assembly-heat sink will be described relative to thyristor fusion, it will be understood of course that transistor and rectifier fusions or combinations thereof may also be used.

The central grooves 26 which are covered by dielectric sheet 130 are filled with, for example, RTV silicon resin to increase the creep resistance of the assembly-heat sink. The filled grooves surround the wafer or fusions 102.

A gate contact 131, not shown, is previously inserted in aperture 82 in cylindrical member 62 and electrical lead 104 in electrical contact with the gate contact is brought out through aperture 80 in the cylindrical member 62.

A second cylindrical member 62 is inserted in the curved portion 24 of base member 10 with contact surface 70 in physical and electrical contact with thyristor wafer or fusion 102.

A second gate contact, not shown, is affixed in aperture 82 of the second cylindrical member 62 and an electrical lead 204 in electrical contact with the second gate contact is brought out through aperture 80 in the second cylindrical member 62.

A second thyristor wafer 202 is inserted with its gate area in electrical and physical contact with the second gate contact and its emitter area in electrical and physical contact with contact surface 68 of the second cylindrical member 62.

A third cylindrical member 62 is inserted in the curved portion 24 of base member 10 with contact surface 68 in physical and electrical contact with the thyristor wafer 202.

A thermistor, 133, may be inserted in aperture 82 of the third cylindrical member 62 with an electrical lead 304 in electrical contact with he thermistor and extending up through aperture 80 in the third cylindrical member 62.

A second end piece 86 together with washer 96 and Belleville washers 98 and electrical insulating disc 100 are assembled, as described above and the rim 88 end piece 86 is inserted into the second groove 126.

A plurality of Belleville washers 98 can be used in conjunction with the two end pieces 86 to provide sufficient compression to ensure electrical contact between the thyristor wafers or fusions and the cylindrical members 62.

In actual practice, the above described assembly is normally carried out in a jig and then positioned in the base member 10. The dielectric sheet 130 electrically insulates the cylindrical members and the fusions from the bottom member or base member 10.

Figure 13:
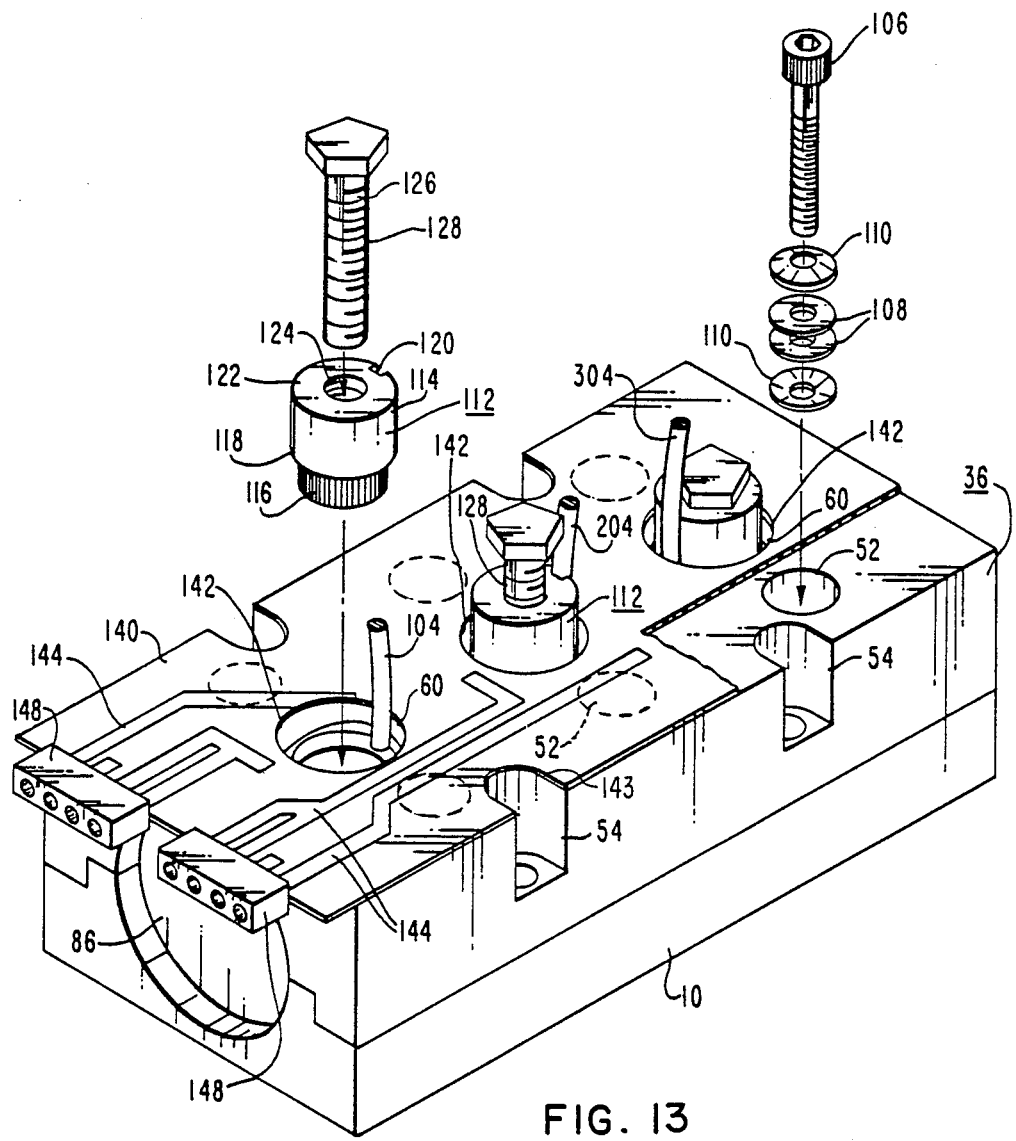
FIG. 13 is an isometric view of the assembly-heat sink of this invention with a printed circuit board disposed on the top surface thereof.

With reference to FIGS. 12 and 13, the dielectric sheet 130 is disposed about cylindircal members 62 as shown in FIG. 11 and top member 36 is then positioned on the base member 10 and the two joined by bolts 106 inserted through apertures 52 in the top member and aperture 34 in the base member 10. The aperture 34 in the base member 10 is threaded to receive the bolts. Bellville washers 108 can be used to ensure the tight clamping of the top member 36 to the base member 10. Electrical insulating washers 110 are also used in securing the top member 36 to the base member 10. Screws or other spring type fasteners may also be used to secure the top member 36 to the base member 10.

The dielectric sheet 130, as shown in FIG. 11 is positioned around the top of the cylindrical members 62 thereby electrically insulating the cylindrical members 62 from the top member 36.

To further ensure the electrical insulation of the thyristor wafers or fusions from the top and base members, and the top and base members from the ambient, the inside surfaces and the outside surfaces of the top and base members can be coated with hardcoat, which is anodized aluminum impregnated with tetrafluoroethylene, or with an insulating material to provide additional dielectric insulation.

The mating of the vertical and horizontal portions of the top surface of the base member 10 with the vertical and horizontal portions of the bottom surface of the top member 36 produces a circuitous path for any leakage currents. In addition, the surfaces may be coated with RTV compounds, epoxies or other such compounds to ensure a tight seal and to prevent leakage currents.

Plugs 112 are comprised of an electrically conductive metal as, for example, copper, aluminum, and nickel-plated copper. The plugs 112 have a major portion 114, a minor portion 116 and a shoulder 118. There is a keyway 120 extending from the shoulder 118 to top surface 122 of the plug 112. There is a centrally disposed aperture 124 extending from the top surface 122 to approximately the shoulder 118. The aperture 124 is threaded.

Plugs 112 are forced under pressure into aperture 74 in cylindrical member 62 (shown in FIGS. 3 and 4) to a depth substantially equal to the length of the minor portion 116 so that the shoulder 118 is in contact with countersunk portion 76 about aperture 74.

The electrical leads 104, 204 and 304 are recessed in the keyways 120.

The plugs 112 are the anode emitter electrical lead for one thyristor wafer or fusion and the cathode emitter electrical lead for the other thyristor wafer or fusion. The two thyristor wafers being connected electrically in a series circuit relationship.

An electrical connection post 126, which contains threads 128 over a portion of its length, and which threads are matched to the threads in aperture 124 of plug 112, is screwed into each plug 112.

The additional length of the posts 126 and the fact that the cylindrical members 62 can rotate allows flexibility in making electrical contact to the thyristor wafers 102 within the assembly-heat sink.

With further reference to FIGS. 12 and 13, a printed circuit board 140, of an electrically insulating material, is positioned on and joined to top surface 38 of top member 26. The board 140 may be joined to top surface 38 by a suitable adhesive as for example an epoxy adhesive.

The circuit board 140 has three apertures 142 therethrough which are superimposed over the apertures 60 in top member 26 and through which plugs 112 extend. The board 140 also has cutaway portions 143 disposed over apertures 54.

The printed circuit board 140 has metallized electrically conductive paths 144 on its surface 146 to facilitate making electrical contact to the gate regions of the thyristor fusions and to the thermistor within the assembly-heat sink.

Contact members 148 are affixed to the electrically conductive paths 144 to allow electrically contacting between the printed circuit board and external members or power supplies.

Wafers or fusions particularly suitable for use with the assembly-heat sink of this invention are those set forth and claimed in U.S. Pat. Nos. 4,235,645 and 4,329,707, the assignee of which is the same as that of the present invention.

It should also be noted that other types of passivated wafers or fusion which do not require a hermetically sealed ambient are suit for use in the assembly-heat sink of this invention.

It should be noted that the assembly-heat sink of this invention is a compression bonded structure with the Belleville washer or any other suitable thrust type washer providing the compression.

It should also be noted that the assembly can be readily disassembled to replace the wafers or fusion.

We claim as our invention:

1. A semiconductor modular assembly comprising, a metal base member and a metal top member, said base member having a top surface, a bottom surface and two end faces said top metal member having a top surface, a bottom surface and two end faces, a central portion of said top surface of said base member being curved and concave relative to said top surface, a central portion of said bottom surface of said top member being curved and concave relative to said bottom surface, whereby when said top member is disposed on said base member, the curved concave portions of said base and top member form a cavity between the end faces of said members, said cavity having a circular cross-section, a plurality of metal cylindrical members disposed within said cavity, semiconductor fusions disposed within said cavity between adjacent cylindrical members, compression means holding said semiconductor fusions in an electrical and thermal conductive relationship with said adjacent metal cylindrical members, means for electrically insulating said cylindrical members and said fusions from said base and top members, and means for making electrical contact to said semiconductor fusions through said cylindrical members.

2. The modular assembly of claim 1 in which said compression means is comprised of thrust washers.

3. The modular assembly of claim 1 in which said means for electrically insulating said cylindrical members and said fusions from said base and top members comprises a blanket of a dielectric material disposed entirely around the cylindrical members and the fusion.

4. The modular assembly of claim 1 in which the means for making electrical contact to said semiconductor fusions comprises electrically conductive plugs press fitted into apertures in said cylindrical members, electrically conductive posts in apertures in said electrically conductive plugs, and a printed circuit board affixed to the top surface of said top member.

5. The modular assembly of claim 1 in which the walls of the concave surfaces of said top member and said base member each form a groove in the vicinity of each end face, said grooves in the bottom surface of said top member being vertically aligned with the grooves in the top surface of said base member when said top member is disposed on said base member.

6. The modular assembly of claim 5 in which end members are disposed in said grooves and thrust washers are disposed between said end members and adjacent cylindrical members.

7. The modular assembly of claim 6 in which an electrically insulating disc is disposed between said thrust washers and said adjacent cylindrical members, whereby said thrust washers and said end members are electrically insulated from said cylindrical members.

8. A semiconductor modular assembly comprising, a metal base member and a metal top member, said base member having a top surface, a bottom surface and two end surfaces, said top member having a top surface, a bottom surface and two end faces, a central portion of said top surface of said base member being curved and concave relative to said top surface, a central portion of said bottom surface of said top member being curved and concave relative to said bottom surface, whereby when said top member is disposed on and bolted to said base member, the concave portions of said base and top member form a cavity between the end surfaces of said members, said cavity having a circular cross-section, a plurality of metal cylindrical members disposed within said cavity, semiconductor fusions disposed within said cavity between adjacent cylindrical members, the walls of said cavity forming a groove in the vicinity of each of said end faces, end members disposed in said grooves, thrust washers and an electrically insulating disc disposed between each of said end members and the adjacent cylindrical member, whereby said cylindrical members and said semiconductor fusions are held in a thermal and electrical conductive relationship by a compressive force from said thrust washers, said electrically insulating disc electrically insulating said thrust washers and said end members from said cylindrical members and semiconductor fusions, a dielectric blanket disposed substantially entirely around said cylindrical members and said semiconductor fusions, whereby said cylindrical members and said semiconductor fusions are electrically insulated from said base member and said top member, metal plugs disposed within apertures in said cylindrical members, said plugs extending through apertures formed by walls in the top surface of said top members, and a printed circuit board disposed upon and affixed to said top surface of said top member.

* * * * *